(12) United States Patent
Kim et al.

(10) Patent No.: US 9,818,782 B2
(45) Date of Patent: Nov. 14, 2017

(54) IMAGE SENSOR AND METHOD FOR FABRICATING THE SAME

(71) Applicant: SK hynix Inc., Gyeonggi-do (KR)

(72) Inventors: Yeoun-Soo Kim, Gyeonggi-do (KR); Il-Ho Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/218,592

(22) Filed: Jul. 25, 2016

(65) Prior Publication Data

US 2016/0336362 A1    Nov. 17, 2016

Related U.S. Application Data

(62) Division of application No. 14/555,390, filed on Nov. 26, 2014, now Pat. No. 9,425,231.

(30) Foreign Application Priority Data

Apr. 14, 2014 (KR) .......................... 10-2014-0044249

(51) Int. Cl.
*H01L 31/0232* (2014.01)
*H01L 27/146* (2006.01)

(52) U.S. Cl.
CPC ...... *H01L 27/1463* (2013.01); *H01L 27/1464* (2013.01); *H01L 27/14612* (2013.01); *H01L 27/14621* (2013.01); *H01L 27/14627* (2013.01); *H01L 27/14629* (2013.01); *H01L 27/14636* (2013.01); *H01L 27/14685* (2013.01)

(58) Field of Classification Search
CPC .......... H01L 27/1463; H01L 27/14636; H01L 27/14612; H01L 27/1464; H01L 27/14629; H01L 27/14621; H01L 27/14627; H01L 27/14685
See application file for complete search history.

(56) References Cited

U.S. PATENT DOCUMENTS

| | | | | |
|---|---|---|---|---|
| 2011/0102657 A1* | 5/2011 | Takahashi | ......... | H01L 27/14634 348/308 |
| 2012/0313208 A1* | 12/2012 | Kim | .................. | H01L 27/14634 257/435 |
| 2014/0264701 A1* | 9/2014 | Tai | .................... | H01L 27/14685 257/435 |

\* cited by examiner

*Primary Examiner* — Dale E Page
*Assistant Examiner* — Wasiul Haider
(74) *Attorney, Agent, or Firm* — IP & T Group LLP

(57) ABSTRACT

An image sensor includes: a first inter-layer dielectric layer formed over a front side of a substrate including photoelectric conversion regions; isolation structures each of which penetrates through the first inter-layer dielectric layer and has a portion buried in the substrate; first metal lines formed over the first inter-layer dielectric layer to correspond to the photoelectric conversion regions; and an optical filter and a light condenser formed over a back side of the substrate.

9 Claims, 8 Drawing Sheets

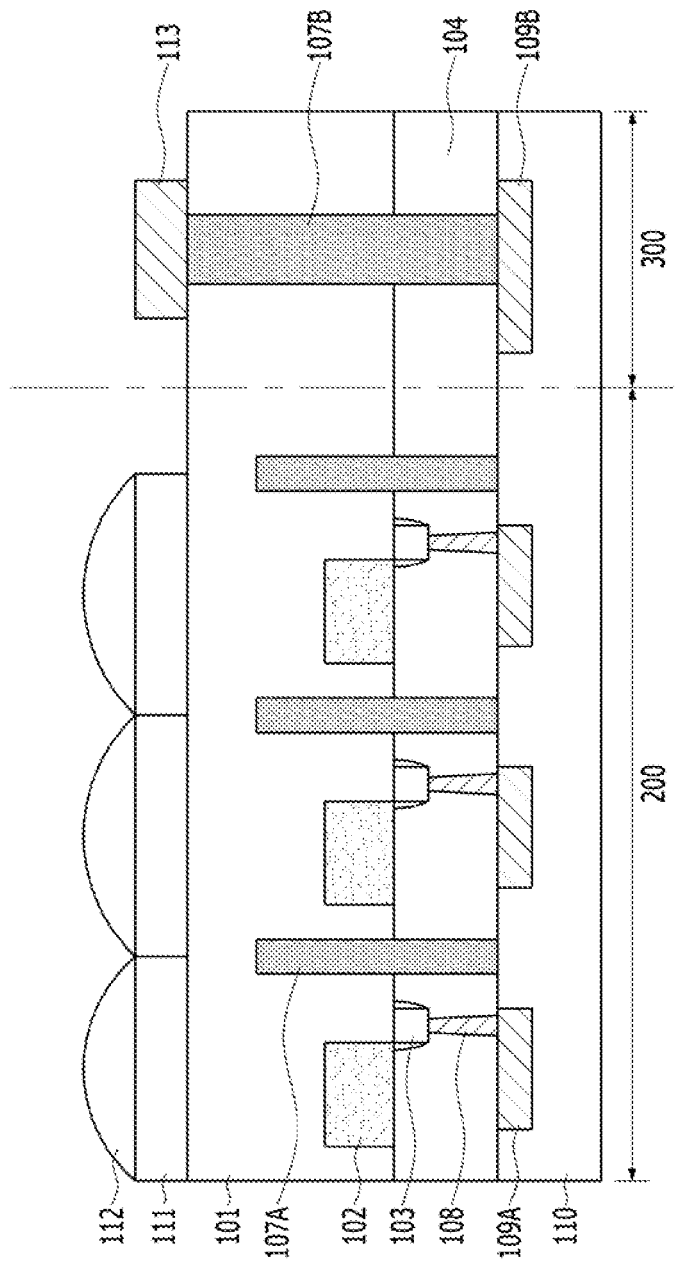

IMAGE SENSOR AND METHOD FOR FABRICATING THE SAME

CROSS-REFERENCE TO RELATED APPLICATIONS

This application is a division of U.S. patent application Ser. No. 14/555,390 filed on Nov. 26, 2014, which claims priority of Korean Patent Application No. 10-2014-0044249, filed on Apr. 14, 2014. The disclosure of each of the foregoing application is herein incorporated by reference in its entirety.

BACKGROUND

1. Field

Exemplary embodiments relate to semiconductor device fabrication technology and, more particularly, to an image sensor and a method for fabricating the same.

2. Description of the Related Art

An image sensor is a device that converts optical images into electrical signals. Image sensors are divided into Charge Coupled Device (CCD) image sensors and Complementary Metal Oxide Semiconductor (CMOS) image sensors (CIS). An image sensor includes a plurality of pixels, and each pixel outputs a pixel signal corresponding to incident light. Each pixel accumulates photocharges corresponding to the incident light through a photoelectric conversion element, such as a photodiode, and outputs pixel signals based on the accumulated photocharges.

The CMOS image sensors may be divided into Front-Side Illumination Image sensors (FIS) and Back-Side Illumination Image sensors (BIS). The back-side illumination image sensors have superior operation characteristics and production yield compared to other kinds of image sensors, such as CCD image sensors and front-side illumination image sensors.

A reflector is used to reflect incident light that missed the target photoelectric conversion element and redirect it back to the target photoelectric conversion element. Since some of the incident light reflected by the reflector does not land on the target photoelectric conversion element, but instead hits neighboring photoelectric conversion elements, crosstalk phenomenon occurs.

SUMMARY

An embodiment is directed to an image sensor that may reduce or eliminate the crosstalk phenomenon caused by image sensor reflectors, and a method for fabricating an image sensor with these properties.

Another embodiment is directed to an image sensor with improved device characteristics, and a method for fabricating the image sensor.

In accordance with an embodiment, an image sensor includes: a first inter-layer dielectric layer formed over a front side of a substrate, wherein the substrate includes photoelectric conversion regions; an isolation structure which penetrates through the first inter-layer dielectric layer between the photoelectric conversion regions and further extends into the substrate; first metal lines formed over the first inter-layer dielectric layer and each aligned with the photoelectric conversion regions; and an optical filter and a light condenser formed over a back side of the substrate.

The image sensor may further include: pixel transistors formed over the front side of the substrate, wherein the first inter-layer dielectric layer is disposed over the pixel transistors. Contact plugs formed in the first inter-layer dielectric layer and coupling the pixel transistors with the first metal lines.

The isolation structure extends into the substrate between the photoelectric conversion regions.

In accordance with another embodiment, an image sensor includes: a substrate including a first region and a second region; photoelectric conversion regions formed in the substrate in the first region; a first inter-layer dielectric layer formed over a front side of the substrate in the first and the second regions; a first isolation structure formed in t he first region, penetrating through the first inter-layer dielectric layer, and further extending into the substrate; a second isolation structure formed in the second region, penetrating through the first inter-layer dielectric layer, and further extending into the substrate, wherein the first isolation structure and the second isolation structure have different line widths and lengths; first metal lines formed over the first inter-layer dielectric layer in the first region; and an optical filter and a light condenser formed over a back side of the substrate in the first region.

The image sensor may further include: a pad formed over the back side of the substrate in the second region and coupled to the second isolation structure, wherein the second isolation structure penetrates through the first inter-layer dielectric layer and the substrate in the second region. The image sensor may further include: pixel transistors formed over the front side of the substrate in the first region, wherein the first inter-layer dielectric layer is disposed over the pixel transistors. Contact plugs coupling the pixel transistors with the first metal lines.

The first isolation structure extends into the substrate between the photoelectric conversion regions. The second isolation structure has a wider line width than the first isolation structure.

In accordance with another embodiment, an image sensor includes: a substrate including a first region, a second region, and a third region; photoelectric conversion regions formed in the substrate in the first region; a first inter-layer dielectric layer formed over a front side of the substrate in the first, the second, and the third regions; a first isolation structure formed in the first region, penetrating through the first inter-layer dielectric layer, and extending into the substrate; a second isolation structure formed in the second region, penetrating through the first inter-layer dielectric layer, and extending into the substrate; a third isolation structure formed in the third region and penetrating through the first inter-layer dielectric layer and substrate; first metal lines formed over the first inter-layer dielectric layer and in the first region; and an optical filter and a light condenser formed over a back side of the substrate in the first region.

In accordance with yet another embodiment, a method for fabricating an image sensor includes: forming photoelectric conversion regions in a substrate in a first region, wherein the substrate includes the first region and a second region; forming a first inter-layer dielectric layer over a front side of the substrate in the first region; forming a first trench and a second trench in the first region and the second region, respectively, by etching the first inter-layer dielectric layer and the substrate in the first and the second regions, wherein the first trench and the second trench have different line widths and lengths, wherein the first trench is provided between the photoelectric conversion regions; forming a first isolation structure and a second isolation structure that gap-fill the first trench and the second trench, respectively; forming first metal lines over the first interlayer dielectric layer in the first region to align with the photoelectric conversion regions forming a second metal line over the first inter-layer dielectric layer in the second region to be coupled with the second isolation structure; forming an optical filter and a light condenser over a back side of the substrate in the first region.

The second trench has a wider line width than the first trench.

The first trench is formed to penetrate through the first inter-layer dielectric layer and extend into the substrate.

The second trench of the second region is formed to penetrate through the first inter-layer dielectric layer and the substrate through an etch process.

The first trench and the second trench are simultaneously formed through a single masking process.

The first isolation structure and the second isolation structure may include an insulating material or a combination of an insulating material and a conductive material.

The second metal line in the second region contact the second isolation structure.

The method may further include: forming pixel transistors over the front side of the substrate in the first region, before forming the first inter-layer dielectric layer.

The method may further include: forming contact plugs coupling the pixel transistors in the first region with the first metal lines and penetrating through the first inter-layer dielectric layer in the first region, before forming the first metal lines.

The method may further include: performing a thinning process on the back side of the substrate in the first region, before forming the optical filter and the light condenser.

The method may further include: forming pads over the back side of the substrate in the second region to contact the second isolation structure, after forming the optical filter and the light condenser.

In accordance with the other embodiment, an image sensor includes: first and second photoelectric conversion regions; first and second metal lines respectively coupled with the first and the second photoelectric conversion regions; and a first isolation structure extending from between the first and second metal lines to between the first and second photoelectric conversion regions. The image sensor may further include: a dielectric layer extending from between the first photoelectric conversion region and the first metal line to between the second photoelectric conversion region and the second metal fine, wherein the first and second photoelectric conversion regions are provided in the substrate, and wherein the first isolation structure penetrates through the dielectric layer and extends into the substrate between the first photoelectric conversion region and the second photoelectric conversion region.

The it age sensor may further include: a substrate including first and second regions, wherein the first and second photoelectric conversion regions are provided in the first region of the substrate, a third metal line provided in the second region at substantially the same level as the first and the second metal lines; and a second isolation structure formed in the second region, coupled to the third metal line, and extending into the substrate in parallel to the first isolation structure, wherein the second isolation structure has a greater width than the first structure.

BRIEF DESCRIPTION OF THE DRAWINGS

FIGS. 5A to 5E are cross-sectional views illustrating a method for fabricating the image sensor in accordance with the second embodiment.

DETAILED DESCRIPTION

Figure 1:
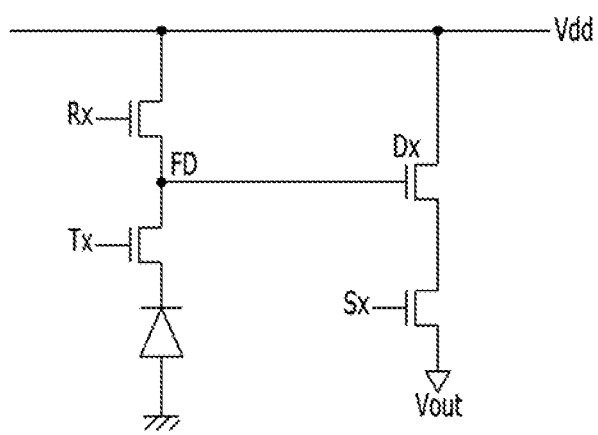
FIG. 1 is a circuit diagram illustrating a unit pixel of an image sensor in accordance with an embodiment.

Exemplary embodiments will be described below in more detail with reference to the accompanying drawings. The embodiments may, however, be modified in different forms and should not be construed as being restrictive or limiting. Throughout the disclosure, reference numerals refer to the same or like parts in the various figures and embodiments.

The drawings are not necessarily to scale and, in some instances, proportions may have been exaggerated in order to dearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Figure 2:
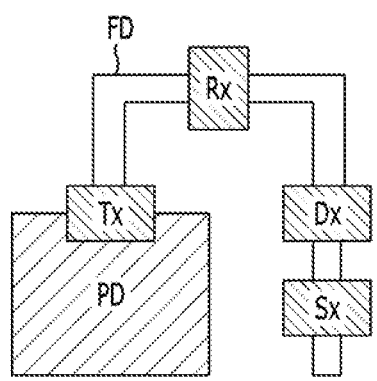
FIG. 2 is a layout of the unit pixel of the image sensor in accordance with the embodiment.

FIG. 1 is a circuit diagram illustrating a unit pixel of an image sensor in accordance with an embodiment. FIG. 2 is a layout of the unit pixel of the image sensor in accordance with the embodiment.

Referring to FIGS. 1 and 2, the unit pixel of the image sensor in accordance with the embodiment may include a photodiode PD, a transfer transistor Tx, a floating diffusion region FD, a reset transistor Rx, a drive transistor Dx, and a selection transistor Sx.

The photodiode PD may be included in a photoelectric conversion region that receives light energy and generates and accumulates photocharges.

The transfer transistor Tx transfers the charges, or photoelectric current, accumulated by the photodiode PD, to the floating diffusion region FD, in response to a transfer control signal inputted into a gate.

The floating diffusion region FD receives the charges generated by the photodiode. PD through the transfer transistor Tx and stores the received charges.

The reset transistor Rx is coupled between a power source voltage Vdd and the floating diffusion region FD, and resets the floating diffusion region FD by draining the charges stored in the floating diffusion region FD to the power source voltage in response to a reset signal RST.

The drive transistor Dx serves as a source follower buffer amplifier, and buffers a signal corresponding to the charges which are charged in the floating diffusion region FD.

The selection transistor Sx performs an addressing function and a switching function for selecting a unit pixel.

Figure 3:
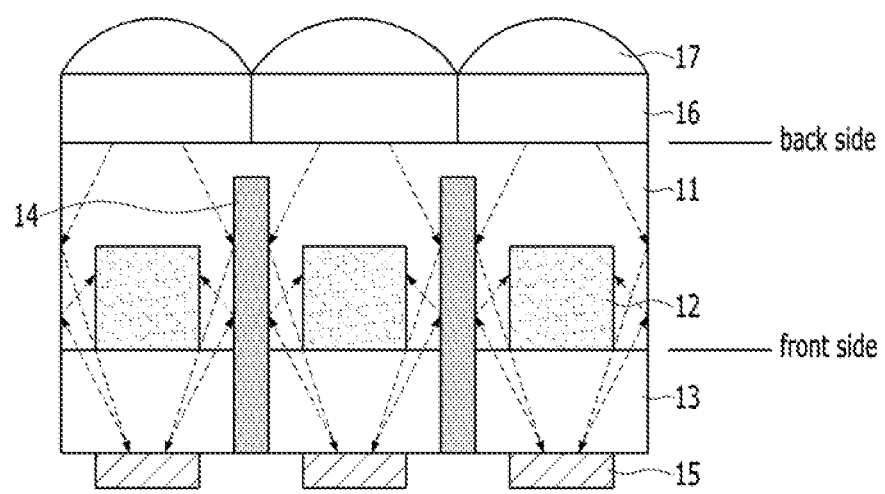
FIG. 3 is a cross-sectional view illustrating an image sensor in accordance with a first embodiment.

FIG. 3 is a cross-sectional view illustrating an image sensor in accordance with a first embodiment.

Referring to FIG. 3, the image sensor in accordance with the first embodiment may include photoelectric conversion regions 12, a first inter-layer dielectric layer 13, and isolation structures 14. The photoelectric conversion regions 12 are formed in a substrate 11 having a plurality of pixels. The first inter-layer dielectric layer 13 is formed over the front-side portion of the substrate 11 and includes a pixel transistor (not shown). The isolation structures 14 penetrate through the first inter-layer dielectric layer 13 and extend in the substrate 11 in buried form. The image sensor in accordance with the first embodiment may further include first metal lines 15 that are formed over the first inter-layer dielectric layer 13 to correspond to the photoelectric conversion regions 12. Although not illustrated in the drawing, the image sensor may further include a stacked structure where inter-layer dielectric layers and metal lines are repeatedly stacked, if necessary.

Also, the image sensor in accordance with the first embodiment may further include an optical filter 16 and a light condensing pattern 17 that are formed on the back side of the substrate 11.

The substrate 11 may include a semiconductor substrate. The semiconductor substrate may be in a monocrystalline state, and the semiconductor substrate may include a silicon-containing material. In short, the substrate 11 may include a monocrystalline silicon-containing material. For example, the substrate 11 may be a bulk silicon substrate, or a Silicon On Insulator (SOI) substrate including a silicon epitaxial layer.

Each of the photoelectric conversion regions 12 may include a plurality of photoelectric conversion elements (not shown) that overlap with each other vertically, and each of the photoelectric conversion elements may be a photodiode including an N-type impurity region and a P-type impurity region. The photoelectric conversion region 12 may penetrate through the substrate 11, thus being exposed to both the front side and back side of the substrate 11. Also, the photoelectric conversion region 12 may be exposed to the front side of the substrate 11 of the photoelectric conversion region 12 while being spaced apart from the back side of the substrate 11 by a predetermined gap.

The first inter-layer dielectric layer 13 may include an oxide, a nitride, an oxynitride, or a combination thereof. The first inter-layer dielectric layer 13 may include a pixel transistor, and may further include contact plugs (not shown) for coupling the first metal lines 15 with the pixel transistor. The pixel transistor may include a transfer transistor Tx for transferring photocharges generated in the photoelectric conversion regions 12 to the floating diffusion region F.

The isolation structures 14 may penetrate through the first inter-layer dielectric layer 13 and a portion of each isolation structure 14 may be buried in the substrate 11 and may be located between the photoelectric conversion regions 12. The isolation structures 14 may prevent the light reflected by the first metal lines 15, which both isolate the photoelectric conversion regions 12 from each other and act as reflectors, simultaneously, from entering the neighboring photoelectric conversion regions 1. The isolation structures 14 may include an insulating material or a combination of an insulating material and a conductive material. For example, the conductive material may include tungsten (W) or polysilicon.

Particularly, the isolation structures 14 may be disposed to surround each photoelectric conversion region 12 to maximize its performance. However, disposition of the isolation structures 14 may be modified diversely.

The first metal lines 15 may include a metal. The first metal lines 15 serves as a reflector for reflecting and redirecting incident light that has not entered the photoelectric conversion regions 12 back into the photoelectric conversion regions 12. The first metal lines 15 may be disposed directly over the photoelectric conversion regions 12.

Also, although the embodiment shows the first inter-layer dielectric layer 13 and the first, metal lines 15 over the front side portion of the substrate 11, the image sensor in accordance with an embodiment may further include a second inter-layer dielectric layer (not shown) formed over the first inter-layer dielectric layer 13. The second inter-layer dielectric layer may be formed in a single layer structure or a multi-layer structure. The second inter-layer dielectric layer may include a stacked structure of a plurality of inter-layer dielectric layers and metal lines, which may constitute a signal generation circuit for generating (or outputting) pixel signals (or electrical signals) corresponding to the photocharges that are generated in the photoelectric conversion region 12 along with the pixel transistors and the first metal lines 15.

The optical filter 16 may include color filters that are formed n an area corresponding to the photoelectric conversion regions 12. For example, the optical filter 16 may be located directly over the photoelectric conversion regions 12. For example, the optical filter 16 may include red, green and blue color filters that correspond to the photoelectric conversion regions 12 of red (R), green (G) and blue (B), respectively. Also, when an image sensor includes an infrared photoelectric conversion region, the optical filter 16 may include an infrared filter corresponding to an Infrared ray receiving device.

The light condensing pattern 17 may include a plurality of micro lenses for guiding incident light entering from the back side of the substrate 11 to be focused onto the photoelectric conversion regions 12 of corresponding pixels. Among the incident light entering through the light condensing pattern 17, light needed by the corresponding optical filter 16, which is the color filters or the infrared filter, is selected, and the selected light may enter the photoelectric conversion region 12 of the corresponding pixel.

Meanwhile, the incident light that did not enter the photoelectric conversion region 12 of the corresponding pixel is reflected by the first metal lines 15 to go back to the photoelectric conversion region 12. An example of this process is illustrated by the arrow mark of FIG. 3 and will be described below. The arrow mark of FIG. 3 illustrates the movement of incident light: that did not enter the photoelectric conversion region 12. As the arrow shows, the light that did not enter the photoelectric conversion regions 12 of the corresponding pixels does not go into the neighboring photoelectric conversion regions 12 due to the isolation structures 14 and the light is redirected to the first metal lines 15. The incident light going to the first metal lines 15 does not go to the neighboring photoelectric conversion regions 12 as it is reflected by the first metal lines 15, but instead goes back to the photoelectric conversion regions 12 of the corresponding pixels.

As described above, according to an embodiment, crosstalk due to incident light entering from the back side and crosstalk due to reflected light produced by a reflector may be suppressed by forming isolation structures 14 which penetrate through the first inter-layer dielectric layer 13 and extend in the substrate 11. To be specific, the isolation structures 14 isolate the first metal lines 15 that serve as the reflector from each other by being extended, not only between the photoelectric conversion regions 12, but also, between the first inter-layer dielectric layer 13.

Figure 4:
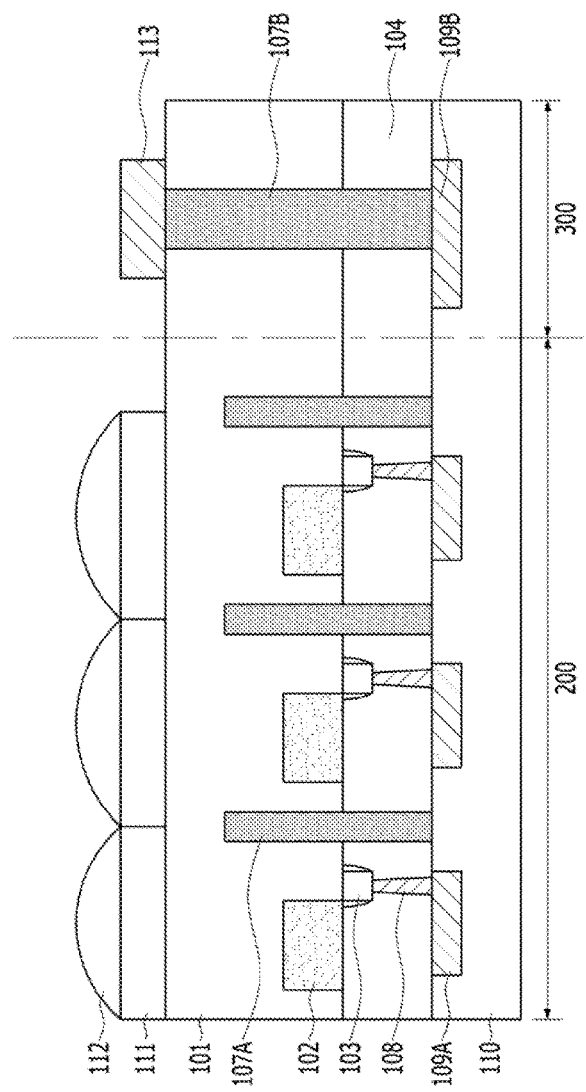
FIG. 4 is a cross-sectional view illustrating an image sensor in accordance with a second embodiment.

FIG. 4 is a cross-sectional view illustrating an image sensor in accordance with a second embodiment.

Referring to FIG. 4, the image sensor in accordance with the second embodiment may include a substrate including a first region 200 and a second region 300. The first region 200 may include a pixel region, and the second region 300 may include a pad region or a chip guard region. In the second embodiment, the second region 300 includes a pad region.

First, a substrate 101 of the first region 200 may include photoelectric conversion regions 102, pixel transistors 103, a first inter-layer dielectric layer 104, first isolation structures 107A, first metal lines 109A, and contact plugs 108.

The photoelectric conversion regions 102 are formed in the substrate 101. In another embodiment, the photoelectric conversion regions 102 may be formed over the substrate 101. The pixel transistors 103 are formed over the front side of the substrate 101. The first inter-layer dielectric layer 104 is formed over the front side of the substrate 101 and over the pixel transistors 103. The first isolation structures 107A penetrate through the first inter-layer dielectric layer 104 and a portion of each first isolation structure 107A extends into the substrate 101. The first metal lines 109A are formed over the first inter-layer dielectric layer 104 and aligned to the photoelectric conversion regions 102. The contact plugs 108 couple the pixel transistors 103 with the first metal lines 109A. Also, the image sensor in accordance with the second embodiment may include an optical filter 111 and a light condensing pattern 112 on the back side of the substrate 101.

The substrate 101 of the second region 300 may include the first inter-layer dielectric layer 104, the second metal lines 109B, pads 113, and second isolation structures 107B. The first inter-layer dielectric layer 104 is formed over the front side of the substrate 101. The second metal lines 109B are formed over the first inter-layer dielectric layer 104. The pads 113 are formed on the back side of the substrate 101. The second isolation structures 107B penetrate through the first inter-layer dielectric layer 104 and the substrate 101 to couple the second metal lines 109B with the pads 113. The second isolation structures 107B may be wider and longer than the first isolation structures 107A.

If the second region 300 includes a pad region rather than a chip guard region, the structure of the second region 300 may be different from FIG. 4. For example, each of the second isolation structures 107B may penetrate through the first inter-layer dielectric layer 104 and extend into the substrate 101. Thus, the second isolation structures 107B are buried in the substrate 101.

Furthermore the substrate 101 of the second region 300 may include a second inter-layer dielectric layer 110 over the first inter-layer dielectric layer 104 of the first region 200 and the second region 300. The second inter-layer dielectric layer 110 may be formed in a single layer structure or a multi-layer structure. The second inter-layer dielectric layer 110 may include a stacked structure of a plurality of inter-layer dielectric layers and metal lines, which may constitute a signal generation circuit for generating (or outputting) pixel signals (or electrical signals) corresponding to photocharges that are generated in the photoelectric conversion regions 102, along with the pixel transistors 103, the contact plugs 108, and the first metal lines 109A.

The photoelectric conversion regions 102, the first inter-layer dielectric layer 104, the first metal lines 109A, the first isolation structures 107A, the optical filter 111 and the light condensing pattern 112 that are formed in the first region 200 may be the same as those shown in FIG. 3.

In short, the substrate 101 corresponds to the reference numeral '11' of FIG. 3, and the substrate 101 may include a semiconductor substrate. The semiconductor substrate may be in a monocrystalline state and may include a silicon-containing material.

The photoelectric conversion regions 102 correspond to the reference numeral '12' of FIG. 3, and the photoelectric conversion regions 102 may include a plurality of photoelectric conversion elements (not shown) that overlap with each other vertically, and each of the photoelectric conversion elements may be a photodiode including an N-type impurity region and a P-type impurity region.

The pixel transistors 103 may include a transfer transistor Tx that transfers the photocharges generated in the photoelectric conversion regions 102 to floating diffusion regions FD.

The first inter-layer dielectric layer 104 corresponds to the reference numeral '13' of FIG. 3 and the first inter layer dielectric layer 104 may include at least one material selected from the group consisting of an oxide a nitride and an oxynitride.

The first metal lines 109A correspond to the reference numeral '15' of FIG. 3, and the first metal lines 109A may include metal. The first metal lines 109A may function as a reflector that reflects and redirects incident light that did not enter the photoelectric conversion regions 102 back into the photoelectric conversion regions 102. The first metal lines 109A may align with the photoelectric conversion regions 102.

The first metal lines 109A and the pixel transistors 103 may be coupled with each other through the contact plugs 108 that penetrate through the first inter-layer dielectric layer 104.

The first isolation structures 107A correspond to the reference numeral '14' of FIG. 3, and the first isolation structures 107A may penetrate through the first inter-layer dielectric layer 104, and extend in the substrate 101. As a result, a portion of each first isolation structure 107A may be buried in the substrate 101 between the photoelectric conversion regions 102. The first isolation structures 107A may prevent reflected light produced by a reflector from proceeding to the neighboring photoelectric conversion regions 102. The first metal lines 109A simultaneously function as a reflector and an isolator for isolating the photoelectric conversion regions 102 from each other. The first isolation structures 107A may include a dielectric material or a mixed structure of a dielectric material and a conductive material. The mixed structure may include a stacked structure of dielectric material and conductive material or a structure where a ring-type dielectric material surrounds a pillar-type conductive material. For example, the first isolation structures 107A may be configured to surround each photoelectric conversion region 102 to maximize the effect. However, the disposition of the first isolation structures 107A may be modified diversely.

The optical filter 111 corresponds to the reference numeral '16' of FIG. 3, and the optical filter 111 may include filters corresponding to the photoelectric conversion regions 102. The light condensing pattern 112 may include a plurality of micro lenses for guiding incident light entering from the back side of the substrate 101 into the photoelectric conversion regions 102 of the corresponding pixels.

The second isolation structures 107B of the second region 300 may function as through-vias that penetrate through the first inter-layer dielectric layer 104 and the substrate 101 to couple the second metal lines 109B with the pads 113. The second isolation structures 107B may include dielectric material and conductive material. The second isolation structures 107B may include a structure where ring-type dielectric material surrounds the sidewalls of a pillar-type conductive material.

Particularly, in the second embodiment, the first isolation structures 107A and the second isolation structures 107B may be formed simultaneously through a one-time mask process, which will be described in detail below with the accompanying drawings. The first isolation structures 107A and the second isolation structures 107B may have different line widths and lengths.

FIGS. 5A to 5E are cross-sectional views illustrating a method for fabricating the image sensor in accordance with the second embodiment shown in FIG. 4. To help in understanding the method, the same reference numerals are used.

Figure 5A:
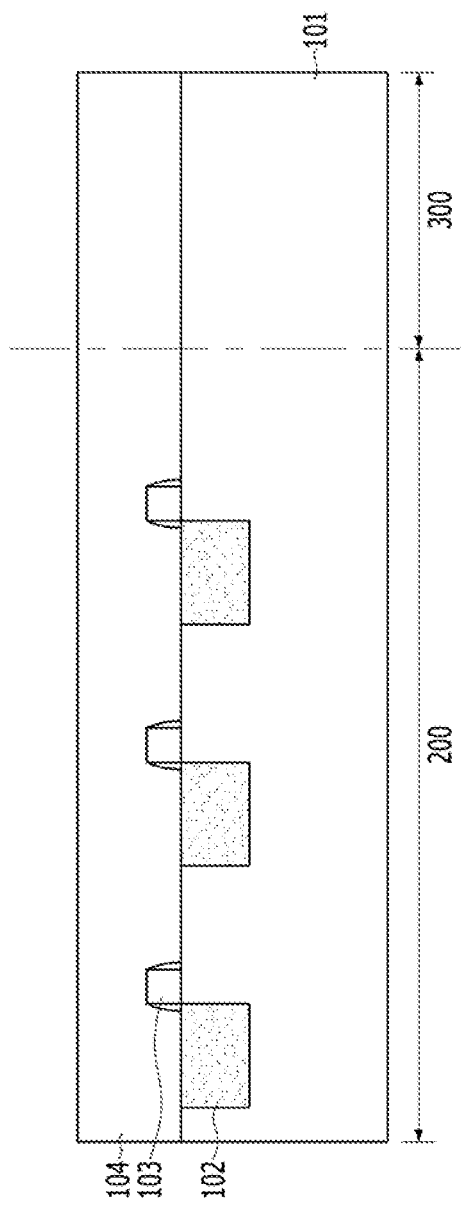

Referring to FIG. 5A, a substrate 101 including a first region 200 and a second region 300 and having a plurality of pixels defined in the first region 200 is prepared. The substrate 101 may include a semiconductor substrate. The first region 200 may be a pixel region, and the second region 300 may be a pad region. However, in another embodiment, the second region 300 may be a chip guard region.

Subsequently, photoelectric conversion regions 102 are formed over the substrate 101 in the first region 200. In another embodiment, the photoelectric conversion regions 102 may be formed in the substrate 101 in the first region 200,. Each of the photoelectric conversion regions 102 may include a plurality of photoelectric conversion elements (not shown) that stack with each other vertically. Each of the photoelectric conversion elements may be a photodiode including an N-type impurity region and a P-type impurity region. The photodiodes may be formed through an impurity ion-implantation process. The photoelectric conversion region 102 may penetrate through the substrate 101 to be exposed to both front side and back sides of the substrate 101. In this embodiment, the photoelectric conversion region 102 is exposed to the front side of the substrate 101 of the photoelectric conversion region 102 while being spaced apart from the back side of the substrate 101 by a predetermined gap.

Subsequently, pixel transistors 103 are formed on the front side of the substrate 101. Each of the pixel transistors may be disposed to align with a portion of each photoelectric conversion region 102, and the pixel transistors may inc Jude a transfer transistor Tx. Herein, although not illustrated in the second region 300, a process of forming a predetermined structure may be performed, if necessary.

Subsequently, a first inter-layer dielectric layer 104 is formed over the front side of the substrate 101 and the pixel transistors 103. The first inter-layer dielectric layer 104 may include an oxide, a nitride, an oxynitride, or a combination thereof.

Figure 5B:
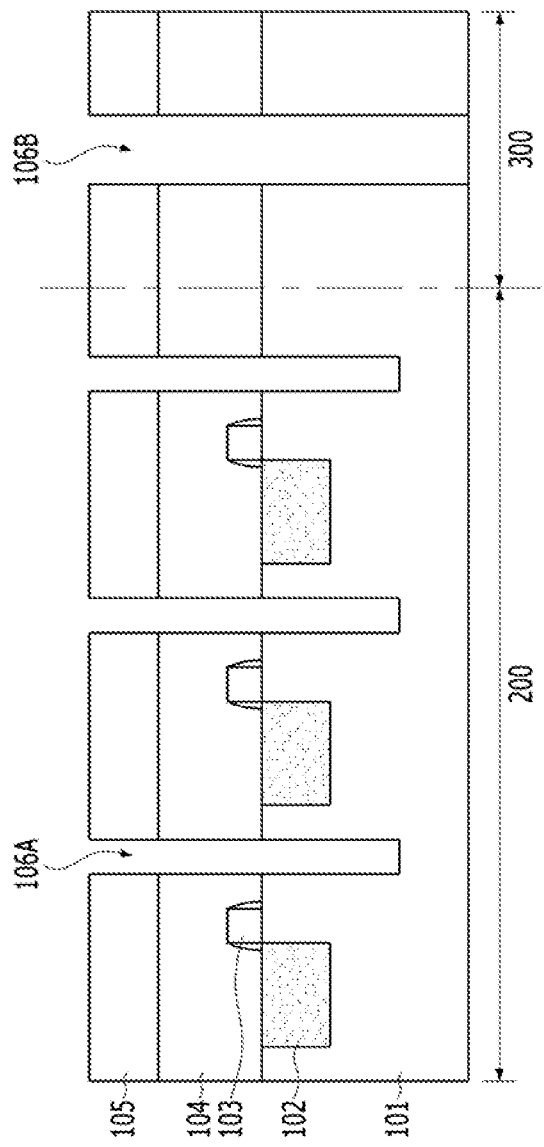

Referring to FIG. 5B, a mask pattern 105 is formed over the first inter-layer dielectric layer 104. The mask pattern 105 may include material having a different etch selectivity against the first inter-layer dielectric layer 104 and against the substrate 101. The mask pattern 105 may be formed by coating an upper portion of the first inter-layer dielectric layer 104 with a photoresist layer, and performing a patterning process through an exposure and development process to form the mask pattern 105. The mask pattern 105 may further include a hard mask under the photoresist layer to obtain a desirable etch selectivity, and may further include an anti-reflection layer under the photoresist layer for preventing reflection when the photoresist layer is subject to the exposure and development process.

Particularly, the isolation structure regions defined by the mask pattern 105 may have different line widths in the first region 200 and the second region 300. This is to take advantage of the difference in etch rate through a loading effect.

Subsequently, first trenches 106A and second trenches 106B, which have different line widths and lengths between the first region 200 and the second region 300, are formed by etching the first inter-layer dielectric layer 104 and the substrate 101 using the mask pattern 105 as an etch barrier.

The first trenches 106A of the first region 200 may penetrate through the first inter-layer dielectric layer 104 between the photoelectric conversion regions 102 and extend in the substrate 101.

The second trenches 106B of the second region 300 may penetrate through both of the first inter-layer dielectric layer 104 and the substrate 101. In another embodiment, the second trenches 106B of the second region 300 may be formed, not to penetrate through the substrate 101, but to extend into the substrate 101 by a predetermined depth in consideration of a subsequent thinning process that will be performed on the substrate 101. The second trenches 106B may have a wider line width than the first trenches 106A.

In another embodiment where the second region 300 includes a chip guard region, each of the second isolation structures 107B may extend deeper than the first trenches 106A but not penetrate through the substrate 101. The second isolation structures 107B may or may not be exposed by the substrate 101 upon completion of a subsequent thinning process.

As described, the trenches with different line widths and lengths may be formed using one mask pattern 105. Under these circumstances, micro loading effects and etch rates change depending on line width. Thus, masking processes do not have to be performed several times, and thus production yield increases.

Subsequently, a curing process may be performed. As a result, dark current caused by defects, such as etch defects, may be prevented. The curing process may be performed at a temperature in which ions, which are implanted to increase the throughput of the device, are activated. Since the curing and/or activation process is performed before the formation of metal lines (not shown), the curing and/or activation process does not affect the characteristics of the device. Therefore, the curing process may be easily performed at a sufficiently high temperature. The curing process may be performed after isolation structures (not shown) are formed and before the metal lines (not shown) are formed.

Figure 5C:
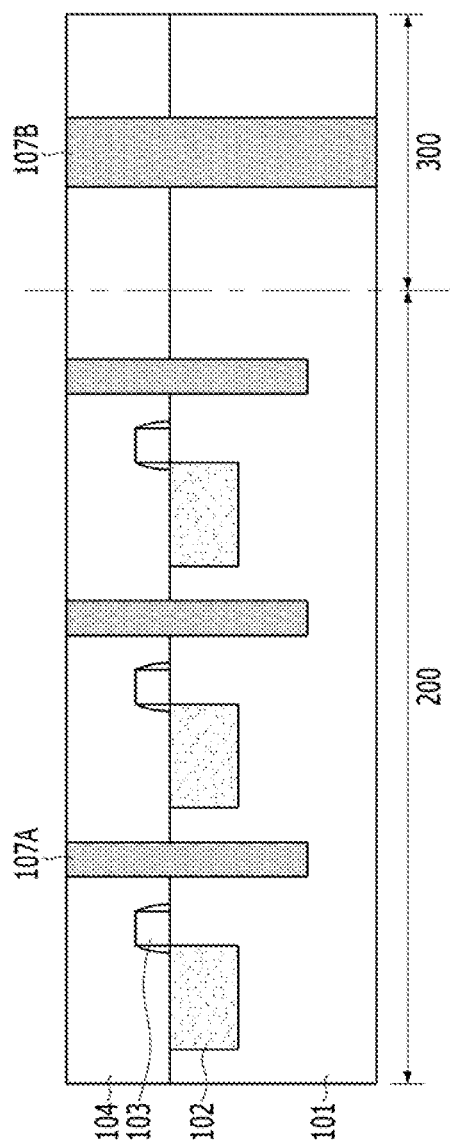

Referring to FIG. 5C, the first isolation structures 107A and the second isolation structures 107B, respectively gap-filling the first trenches 106A and the second trenches 106B, are formed. The first isolation structures 107A may include dielectric material or a mixed structure of dielectric material and conductive material. The second isolation structures 107B may include dielectric material and conductive material.

To be specific, dielectric material may be formed over the substrate structure including the first trenches 106A and the second trenches 106B. The dielectric material may be formed through a deposition process or through an oxidation process. The first trenches 106A having a narrower line width may all be gap-filled with the dielectric material.

Subsequently, a spacer etch process may be performed in such a manner that the dielectric material remains on sidewalls of the second trenches 106B. The dielectric material remaining on the sidewalls of the second trenches 106B may prevent a short between the substrate 101 and conductive material, formed in a subsequent process, and facilitate the burying of the conductive material.

Subsequently, conductive material fills the second trenches 106B. For example, the conductive material may include tungsten (W) or polysilicon. The remaining portions of the first trenches 106A that are not filled with the dielectric material, if any, may be gap-filled with the conductive material. The conductive material filling the second trenches 106B may serve as through-vias that couple the metal lines with pads in the subsequent process.

Subsequently, the dielectric material and the conductive material are etched until the first inter-layer dielectric layer 104 is exposed. The dielectric material and the conductive material may be etched through a planarization process. The planarization process may be a blanket etch process, such as an etch-back process, or a Chemical Mechanical Polishing (CMP) process. The mask pattern 105 (refer to FIG. 5B) may be removed before the dielectric material is exposed, or may be removed along with the dielectric material and the conductive material in the planarization process. As a result, the first isolation structures 107A are separated from each other. Likewise, the second isolation structures 107B are separated from the first isolation structures 107B.

As a result, the first isolation structures 107A may include dielectric material or a mixed structure of dielectric material and conductive material, and the second isolation structures 107B may include a concentric structure where a ring-type dielectric material surrounds sidewalls of a pillar-type conductive material.

Figure 5D:
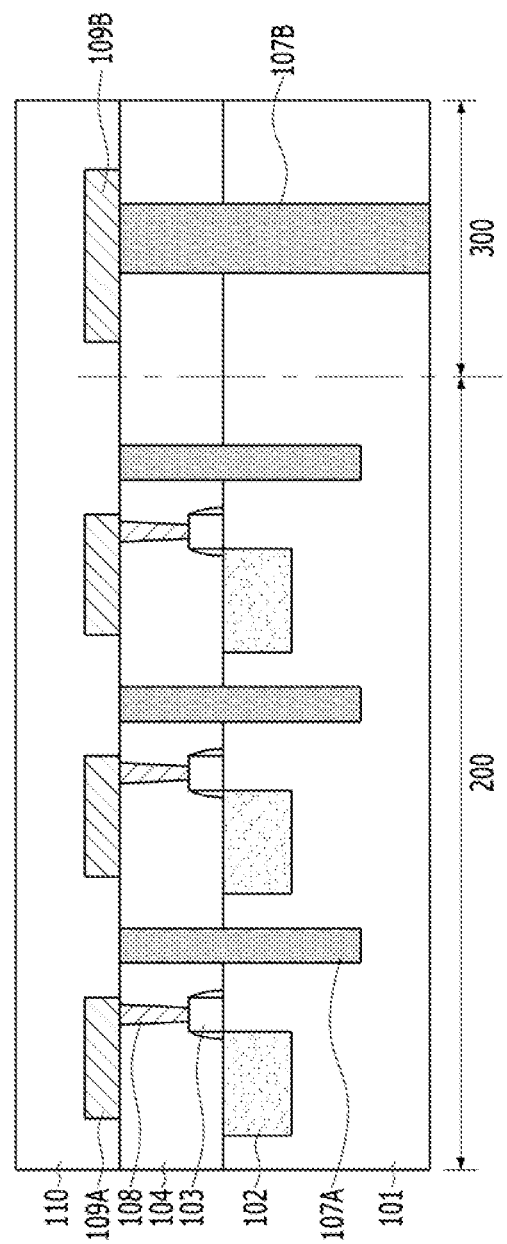

Referring to FIG. 5D, first metal lines 109A and second metal lines 109B are formed over the first inter-layer dielectric layer 104. The first metal lines 109A of the first region 200 may be coupled with the pixel transistors 103 by the contact plugs 10B, and the second metal lines 109B of the second region 300 may contact the second isolation structures 107B. Particularly, the first metal lines 109A of the first region 200 may serve as a reflector for reflecting and redirecting incident light that did not enter the photoelectric conversion regions 102, and the first metal lines 109A of the first region 200 may align with the photoelectric conversion regions 102.

Subsequently, a second inter-layer dielectric layer 110 is formed over the first inter-layer dielectric layer 104 including the first metal lines 109A. The second inter-layer dielectric layer 110 may include the same material as the first inter-layer dielectric layer 104. The second inter-layer dielectric layer 110 may be formed in a single layer or a multi-layer structure, and it may further include a stacked structure of a plurality of inter-layer dielectric layers and metal lines.

Referring to FIG. 5E, the thickness of the substrate 101 is decreased by performing a thinning process on the back side of the substrate 101. This is to increase light reception efficiency by reducing the distance it takes light to arrive at the photoelectric conversion regions 102. The thinning process may be performed through a backgrinding process or a polishing process. When the second isolation structures 107B are formed spaced apart from the back side of the substrate 101 by a predetermined thickness, the thinning process is performed to expose the second isolation structures 107B on the back side of the substrate 101 so that the second isolation structures 107B penetrate through the first inter-layer dielectric layer 104 and the substrate 101.

Subsequently, an optical filter 111 and a light condensing pattern 112 are formed on the back side of the substrate 101 of the first region 200. The optical filter 111 may include filters corresponding to the photoelectric conversion regions 102. The light condensing pattern 112 may include a plurality of micro lenses for guiding incident light entering from the back side of the substrate 101 to the photoelectric conversion regions 102 of the corresponding pixels.

Subsequently, pads 113 may be formed to be coupled with the second isolation structures 107B on the back side of the substrate 101 of the second region 300.

Particularly, the second isolation structures 107B of the second region 300 are simultaneously formed when the first isolation structures 107A are formed in this embodiment. In short, the second isolation structures 107B that penetrate through the substrate 101 function as alignment keys for a subsequent deposition process, which is performed on the back side of the substrate 101, after the thinning process. Accordingly, an additional process of forming an alignment key may be omitted, which was required in conventional art. Therefore, a fabrication process may be simplified and process margin and production yield may be improved.

According to an embodiment, crosstalk phenomenon caused by reflectors may be prevented by forming isolation structures that extend through an inter-layer dielectric layer.

According to an embodiment, trenches with different line widths and lengths may be concurrently formed through a single masking process by taking advantage of a loading effect, which simplifies the fabrication process.

According to an embodiment, device characteristics may be improved because it is possible to perform a thermal treatment for curing the isolation structures before the formation of metal lines.

What is claimed is:

1. An image sensor, comprising:
a substrate including a first region and a second region;
photoelectric conversion regions formed in the substrate in the first region;
a first inter-layer dielectric layer formed over a front side of the substrate in the first and the second regions;
a first isolation structure formed in the first region, fully penetrating through the first inter-layer dielectric layer, and further extending into the substrate;
a second isolation structure formed in the second region, penetrating through the first inter-layer dielectric layer, and further extending into the substrate, wherein the first isolation structure and the second isolation structure have different line widths and lengths;
first metal lines formed over the first inter-layer dielectric layer in the first region; and
an optical filter and a light condenser formed over a back side of the substrate in the first region,
wherein the first isolation structure extends from between adjacent first metal lines to between neighboring photoelectric conversion regions.

2. The image sensor of claim 1, further comprising:
a pad formed over the back side of the substrate in the second region and coupled to the second isolation structure,
wherein the second isolation structure penetrates through the first inter-layer dielectric layer and the substrate in the second region.

3. The image sensor of claim 1, further comprising:
pixel transistors formed over the front side of the substrate in the first region,
wherein the first inter-layer dielectric layer is disposed over the pixel Transistors.

4. The image sensor of claim 2, wherein the first inter-layer dielectric layer further includes:
contact plugs coupling the pixel transistors with the first metal lines.

5. The image sensor of claim 1, wherein the first isolation structure extends into the substrate between the photoelectric conversion regions.

6. The image sensor of claim 1, wherein the second isolation structure has a wider line width than the first isolation structure.

7. The image sensor of claim 1, wherein the first isolation structure is formed between adjacent first metal lines.

8. An image sensor, comprising:
a substrate including a first region and a second region;

photoelectric conversion regions formed in the substrate in the first region;

a first inter-layer dielectric layer formed over a front side of the substrate in the first and the second regions;

a first isolation structure formed in the first region, penetrating through the first inter-layer dielectric layer, and further extending into the substrate;

a second isolation structure formed in the second region, penetrating through the first inter-layer dielectric layer, and further extending into the substrate, wherein the first isolation structure and the second isolation structure have different line widths and lengths;

first metal lines formed over the first inter-layer dielectric layer in the first region; and an optical filter and a light condenser formed over a back side of the substrate in the first region, wherein the first isolation structure extends from between adjacent first metal lines to between neighboring photoelectric conversion regions.

9. The image sensor of claim 8, wherein the first isolation structure extends from a front side of the first inter-layer dielectric layer into the substrate between the photoelectric conversion regions.

* * * * *